(12) United States Patent
Labanc et al.

(10) Patent No.: US 11,038,479 B2
(45) Date of Patent: Jun. 15, 2021

(54) HIGH POWER AMPLIFIER CIRCUIT WITH PROTECTIVE FEEDBACK CIRCUIT

(71) Applicant: Comet AG, Flamatt (CH)

(72) Inventors: Anton Labanc, Ehrenkirchen (DE); Daniel Gruner, Müllheim (DE)

(73) Assignee: Comet AG, Flamatt (CH)

( * ) Notice: Subject to any disclaimer, the term of this patent is extended or adjusted under 35 U.S.C. 154(b) by 68 days.

(21) Appl. No.: 16/486,544

(22) PCT Filed: Feb. 19, 2018

(86) PCT No.: PCT/EP2018/054043
§ 371 (c)(1),
(2) Date: Aug. 16, 2019

(87) PCT Pub. No.: WO2018/153818
PCT Pub. Date: Aug. 30, 2018

(65) Prior Publication Data
US 2021/0075380 A1    Mar. 11, 2021

(30) Foreign Application Priority Data

Feb. 22, 2017  (EP) .................................... 17157492

(51) Int. Cl.
*H03F 1/34*         (2006.01)
*H03F 3/195*        (2006.01)
(Continued)

(52) U.S. Cl.
CPC ............. *H03F 3/195* (2013.01); *H03F 1/523* (2013.01); *H03F 3/245* (2013.01);
(Continued)

(58) Field of Classification Search
CPC ......................................................... H03F 1/34
(Continued)

(56) References Cited

U.S. PATENT DOCUMENTS 6,614,633 B1 *  9/2003  Kohno ................ H01L 27/0266
                                            361/111
9,673,853 B2 *  6/2017  Blum ......................... H03F 3/19
(Continued)

FOREIGN PATENT DOCUMENTS

EP       2757688 A1    7/2014
WO       03049281 A1   6/2003
WO    2016137648 A1    9/2016

OTHER PUBLICATIONS

International Search Report and Written Opinion for PCT/EP2018/054043 dated Apr. 18, 2018 (8 pages).

*Primary Examiner* — Henry Choe
(74) *Attorney, Agent, or Firm* — The Webb Law Firm

(57) ABSTRACT

Disclosed is an amplifier circuit for providing an output of at least 100 W, preferably of at least 200 W and most preferably of at least 250 W comprising a field effect transistor. A drain of the field effect transistor is connected with a protective feedback circuit. The protective feedback circuit is arranged to reduce an over-voltage energy at the drain of the field effect transistor if the voltage between the gate and a drain of the field effect transistor exceeds a feedback threshold voltage. Further disclosed is a radio frequency amplifier comprising an amplifier circuit, an electrical radio frequency generator comprising the radio frequency amplifier and a plasma processing system comprising an electrical radio frequency generator. Still further disclosed is a method of protecting a field effect transistor in an amplifier circuit.

17 Claims, 5 Drawing Sheets

(51) Int. Cl.
*H03F 1/52* (2006.01)
*H03F 3/24* (2006.01)

(52) U.S. Cl.
CPC .. *H03F 2200/426* (2013.01); *H03F 2200/444* (2013.01); *H03F 2200/451* (2013.01)

(58) Field of Classification Search
USPC ............ 330/294, 94, 95, 87, 82, 75, 93, 293
See application file for complete search history.

(56) References Cited

U.S. PATENT DOCUMENTS

| | | |
|---|---|---|
| 2003/0215373 A1 | 11/2003 | Reyzelman |
| 2004/0095699 A1 | 5/2004 | Kohno |
| 2004/0105664 A1 | 6/2004 | Ivankovic |
| 2012/0139643 A1 | 6/2012 | Scott et al. |

* cited by examiner

HIGH POWER AMPLIFIER CIRCUIT WITH PROTECTIVE FEEDBACK CIRCUIT

CROSS-REFERENCE TO RELATED APPLICATIONS

This application is a national stage of, and claims priority to, Patent Cooperation Treaty Application No. PCT/EP2018/054043, filed on Feb. 19, 2018, which application claims priority to European Application No. EP17157492.4, filed on Feb. 22, 2017, which applications are hereby incorporated herein by reference in their entireties.

TECHNOLOGICAL FIELD

The disclosure relates to an amplifier circuit comprising a protective feedback circuit which is arranged to protect a field effect transistor (FET) like, for example, a metal oxide semiconductor field-effect transistor (MOSFET) against destructive breakdown. The disclosure further relates to a radio frequency amplifier arrangement comprising such an amplifier circuit, an electrical radio frequency generator comprising the radio frequency amplifier arrangement and a plasma processing system comprising the electrical radio frequency generator. The disclosure still further relates to a method of protecting a field effect transistor.

BACKGROUND

There are a number of failure mechanisms of a FET especially a MOSFET. The isolating layer of the gate may be destroyed if the voltage between gate and source is too high. Another failure mechanism may be overheating of the FET which may be caused, for example, by an impedance mismatch of the load. Furthermore, a drain source breakdown may happen if the voltage between drain and source gets too high. The drain source breakdown may be characterized as punch through, avalanche breakdown or snap back, each describing a different drain source breakdown mechanism, wherein it is difficult especially in high power and high frequency applications to identify which mechanism destroyed the FET.

SUMMARY

It is an object of the present disclosure to provide a more robust amplifier circuit.

According to a first aspect an amplifier circuit for providing an output of at least 100 W, preferably of at least 200 W and most preferably of at least 250 W is provided. The amplifier circuit comprises a field effect transistor (FET). A drain of the FET is connected with a protective feedback circuit. The protective feedback circuit is arranged to reduce an over-voltage energy at the drain of the FET if the voltage between the gate and a drain of the FET exceeds a feedback threshold voltage.

An amplifier or amplifier arrangement for high-frequency applications (nominal operating frequency between 1 MHz and 100 MHz, especially between 5 MHz and 85 MHz) has to withstand, for example, in plasma processing applications (e.g. using plasma chamber) variations of the load impedance. Even a short mismatch of the load impedance (arc discharge in the plasma) may cause reflection of power such that the peak voltage at the drain of an FET comprised by the amplifier may be a multiple of the supply voltage. An amplifier circuit may comprise high ruggedness FETs which are arranged to withstand, for example, such an overvoltage by converting a part of the over-voltage energy to heat. There are rare cases that one or more of the high ruggedness FETs in a conventional amplifier circuit are destroyed despite of this feature of the FETs. Detailed experimental investigations have shown that, for example, during an arc discharge in a plasma, energy stored in a matching network is reflected back to the amplifier circuit (or more precisely a high-frequency generator comprising the amplifier circuit). The energy at the drain gets too high and one or more FETs is destroyed within a few high-frequency periods if the phases of the reflected and incident voltage wave constructively superpose (over-voltage at the drain). A straightforward solution would be replacement of the FETs by means of FETs of a higher drain voltage rating (if available) or by means of combining of multiple amplifiers with lower output power. This solution is costly and place consuming.

The protective feedback circuit is electrically connected with the drain and enables dissipation of at least a part of the over-voltage energy within a very short period of time. The protective feedback circuit is preferably arranged to reduce the over-voltage energy within less than three or even two high-frequency periods.

The protective feedback circuit may preferably electrically connect the drain of the FET with a gate of the FET. Over-voltage between drain and source is critical and may cause destruction of the FET. The voltage between source and gate is in case of an over-voltage between drain and source around 0 Volt. The voltage between the gate and the drain is therefore essentially the same as the voltage between drain and gate. The voltage between drain and gate can therefore be used to control the protective feedback circuit. The electrical connection between the drain and the gate of the FET by means of the protective feedback circuit enables usage of the controllable conductivity of the FET to reduce the over-voltage energy at the drain.

The protective feedback circuit may, for example, be arranged to build up a conducting path in the FET such that at least a part of the over-voltage energy at the drain is dissipated by means of the conducting path. The over-voltage at the drain is used in this case to partly open the FET at a time at which the FET is normally closed. Opening of the FET provides a controlled conducting path to lower the over-voltage energy at the drain. A part of the over-voltage energy is in this arrangement dissipated in the FET without destroying the FET. The rest (a limited amount) of the energy may be dissipated in form of avalanche breakdown of the body diode without causing snap-back and destroying the high-ruggedness FET.

The protective feedback circuit may be arranged to increase a gate voltage of the field effect transistor above a gate threshold voltage after the voltage between the gate and the drain exceeds the feedback threshold voltage. The protective feedback circuit does essentially not disturb normal operation of the amplifier circuit. Opening of the drain source path of the FET by means of increasing the gate voltage above the gate threshold voltage should essentially be limited to over-voltage situations in which the FET can be destroyed.

The protective feedback circuit may be arranged to reduce an energy of an avalanche breakdown of the FET. High-ruggedness FETs especially power MOSFETs are constructed or arranged to withstand an avalanche breakdown as long as the thermal energy dissipated in the FET during the avalanche breakdown does not destroy the FET and the avalanche energy is not high enough to open parasitic BJT (snap-back). The effort to avoid an avalanche breakdown of the FET or FETs may be high. It may therefore be preferred to allow an avalanche breakdown of the FET of the amplifier circuit but limit the energy of the avalanche breakdown by means of the protective feedback circuit. There may thus be a voltage range below the feedback threshold voltage in which avalanche breakdown happens without that the protective circuit reduces the over-voltage energy at the drain. The protective circuit reduces the energy after the avalanche breakdown happens if the voltage between drain and gate (or drain and source see above) exceeds the feedback threshold voltage.

The protective feedback circuit may comprise a voltage reference. The voltage reference is arranged to open a current path if the voltage between the drain and the source of the field effect transistor exceeds the feedback threshold voltage. The voltage reference determines the feedback threshold voltage at which over-voltage energy at the drain is reduced by means of the protective feedback circuit. The voltage reference may, for example, determine when the voltage at the gate of the FET is increased in order to open the conducting path of the FET for dissipating at least a part of the over-voltage energy.

The voltage reference may, for example, comprise at least one avalanche diode arranged between the drain and the gate of the field effect transistor. The at least one avalanche diode is arranged to open the current path. Avalanche diodes are cheap. The protective feedback circuit may therefore be realized in a simple and especially economically efficient way. The protective feedback circuit may comprise two, three, four or more avalanche diodes, for example, in a serial arrangement. Alternative voltage references may be any kind of suitable transistors (e.g. bipolar transistors or FETs) or integrated circuits optionally in combination with other passive circuit elements like resistors in order to determine or define the feedback threshold voltage.

The protective feedback circuit may comprise a capacitance arranged between the drain and the gate of the field effect transistor. One or more avalanche diodes or other voltage references are arranged parallel to the capacitance. The capacitance may be arranged to provide the main current path for reducing the over-voltage energy at the drain. The capacitance may especially be arranged to increase the voltage at the gate in order to open the conducting path for dissipating at least a part of the over-voltage energy.

The protective feedback circuit may comprise a switching diode arranged between the capacitance and the drain. The capacitance value should be adjusted to provide an RF short around the voltage reference (e.g. avalanche diodes). The switching diode is arranged to charge the capacitance to a peak voltage between drain and gate. The switching diode may, for example, be a fast Schottky diode. The switching diode opens as soon as a voltage between drain and gate exceeds the sum of the voltage at the capacitance and a threshold voltage of the switching diode. The threshold voltage of the switching diode may be small and therefore negligible. The switching diode opens the current path across the capacitance for short time periods during charging of the capacitance. The FET may shortly open during these short time periods due to the feedback provided via the capacitance. Opening of the FET is unwanted but does not hurt because of the shortness of the time periods. The FET is closed again in the steady state of the drain voltage. The voltage between drain and gate during normal operation is equal or lower than the voltage on the capacitor. The switching diode is therefore closed during normal operation. As soon as the voltage between drain and gate exceeds the feedback threshold voltage a conductive bridge (e.g. through the one or more avalanche diodes or other kind of voltage reference) is opened such that a further rise of the voltage at the capacitance is avoided. The switching diode opens a current path to gate through the capacitance in any case when the voltage between drain and gate rises above the feedback threshold voltage and opens the FET. The FET provides the conducting path for dissipating at least a part of the over-voltage energy at the drain.

The protective feedback circuit may comprise one or more resistors (damping resistors) arranged between voltage reference (e.g. at least one avalanche diode) and the gate of the field effect transistor. The resistor is arranged to stabilize the protective feedback circuit. Without damping the field effect transistor of the amplifier circuit could oscillate at high frequencies due to parasitic capacitance of the (idle) protective feedback or at low frequencies due to very strong feedback when the protective feedback is turning on. The amplifier circuit should not be disturbed by means of the protective feedback circuit during normal operation as described above. The one or more resistors may in certain examples (depends on FET and other components) therefore be arranged to adjust a feedback impedance in order to avoid transistor oscillation.

The amplifier circuit may comprise two field effect transistors arranged in a push-pull arrangement. Each of the field effect transistors is protected by a respective protective feedback circuit as described above. The amplifier circuit may alternatively comprise three, four or more transistors which are protected by means of the protective feedback circuit.

According to a second aspect a radio frequency amplifier arrangement is provided. The amplifier arrangement comprises an amplifier circuit as described above. The amplifier arrangement is characterized by a nominal operating frequency between 1 MHz and 100 MHz, more preferably between 5 MHz and 85 MHz. The radio frequency amplifier arrangement may comprise an input network for matching an impedance of the signal source to the impedance of the gate of the one or more FETs. The radio frequency amplifier may further comprise an output matching network which is arranged to match an impedance of a load to the one or more FETs of the amplifier circuit.

The radio frequency amplifying arrangement may preferably comprise an amplifier circuit in a push-pull arrangement.

According to a third aspect, an electrical radio frequency generator for supplying electrical radio frequency (RF) power to a load, especially plasma, is provided. The electrical RF generator comprises a radio frequency amplifier arrangement as described above.

The electrical RF generator may further comprise a control circuit. The control circuit comprises at least one processing device, at least one memory device, at least one power measurement device and at least one frequency generator. The control circuit may be adapted to drive the radio frequency amplifier arrangement in a pulsed mode or a continuous mode.

According to a fourth aspect of the disclosure, a plasma processing system is provided. The plasma processing system comprises the electrical radio frequency generator comprising an output matching network as described above and a plasma chamber. The plasma is generated in the plasma chamber which comprises supply devices for providing chemical components, such as processing gases, wherein the plasma chamber enables or is arranged to provide physical boundary conditions to enable a stable plasma process.

According to a fifth aspect, a method of protecting a field effect transistor in an amplifier circuit for providing an output of at least 100 W, preferably of at least 200 W and most preferably of at least 250 W is provided. The method comprises the steps of:
providing a feedback threshold voltage,
reducing an energy at the drain of the field effect transistor if a voltage between a gate and a drain of the field effect transistor exceeds the feedback threshold voltage.

It shall be understood that a method of the disclosure and an amplifier circuit of the disclosure may include similar and/or identical features as shown in various examples.

It shall be understood that a preferred example of the disclosure can also be any combination of the dependent claims with the respective independent claim.

Further advantageous examples are defined below.

BRIEF DESCRIPTION OF THE DRAWINGS

These and other aspects of the disclosure will be apparent from, and elucidated with reference to the examples described hereinafter.

The disclosure will now be described, by way of example, based on examples with reference to the accompanying drawings.

In the drawings:

FIG. 1 shows a sketch of an example circuit comprising a conventional push pull radio frequency amplifier.

FIG. 2 shows a sketch of an example of a laterally diffused metal oxide semiconductor (LDMOS) field effect transistor with parasitic elements.

FIG. 3 shows a measured drain source voltage during fatal breakdown of a field effect transistor.

FIG. 4 shows a measured gate source voltage during fatal breakdown of the field effect transistor.

FIG. 5 shows a first example of an amplifier circuit comprising a protective feedback circuit.

FIG. 6 shows the protective effect of the protective feedback circuit.

FIG. 7 shows a second example of an amplifier circuit comprising a protective feedback circuit.

FIG. 8 shows an alternative example of the voltage reference.

FIG. 9 shows a further alternative example of the voltage reference.

In the Figures, like numbers refer to like objects throughout. Objects in the Figures are not necessarily drawn to scale. In the figures, unless explicitly stated otherwise, frequencies are expressed in megahertz (MHz), magnitudes of impedances in Ohm, and phases of impedances in degrees of angle.

DETAILED DESCRIPTION OF EXAMPLES

Various examples of the disclosure will now be described by means of the Figures.

Figure 1:
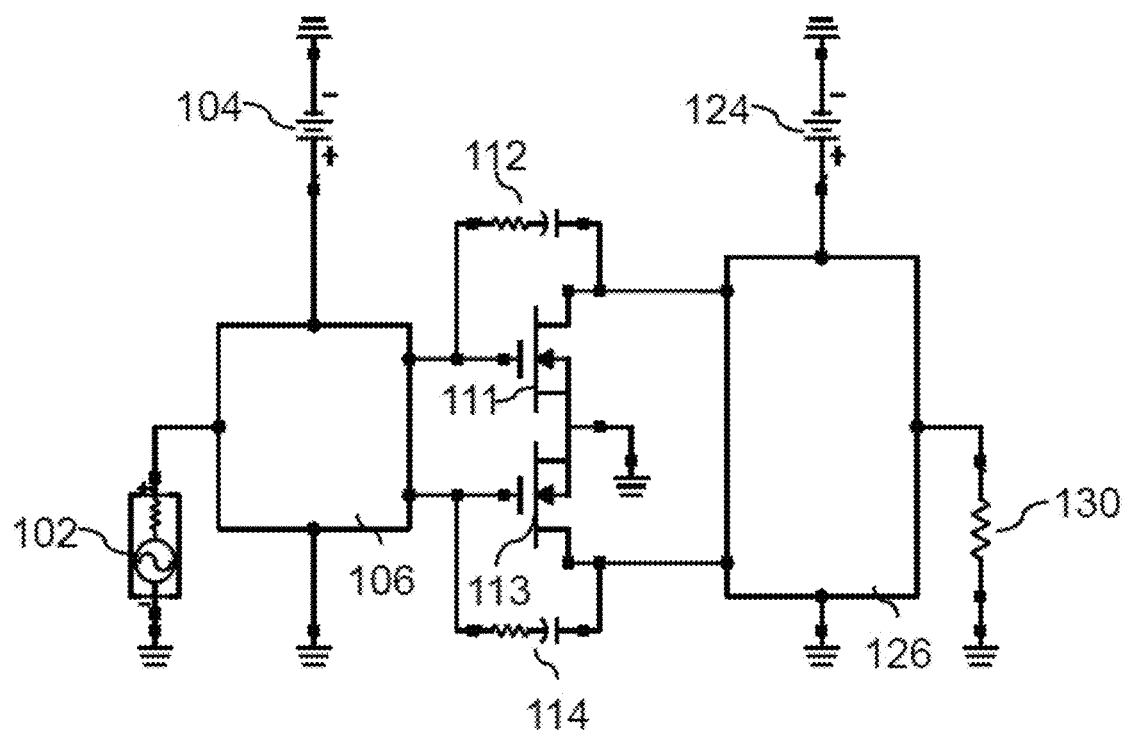

FIG. 1 shows a sketch of an example circuit comprising a conventional push-pull radio frequency amplifier. A passive input network 106 matches an impedance of a signal source 102 with an impedance of gates of field effect transistors (FETs) 111, 113. The input network 106 stabilizes the amplifier circuit and usually comprises resistors. The input network 106 may therefore be lossy. A gate bias voltage is provided by means of a gate bias voltage source 104 via the input network 106 in order to control bias currents of the FETs 111, 113. Drains of the FETs 111, 113 which are arranged in a push-pull arrangement are connected with a usually passive output network 126 matching an impedance of a load 130 (e.g. impedance of a plasma chamber during operation) with an output impedance of the FETs 111, 113. Each of the FETs 111, 113 comprises in this example an optional stabilizing feedback circuit 112, 114. The optional stabilizing feedback circuits 112, 114 reduce amplification of the FETs 111, 113 in order to avoid unwanted oscillations of the FETs 111, 113. Stabilizing feedback circuits 112, 114 usually comprise resistors and capacitors as shown in FIG. 1.

Figure 2:
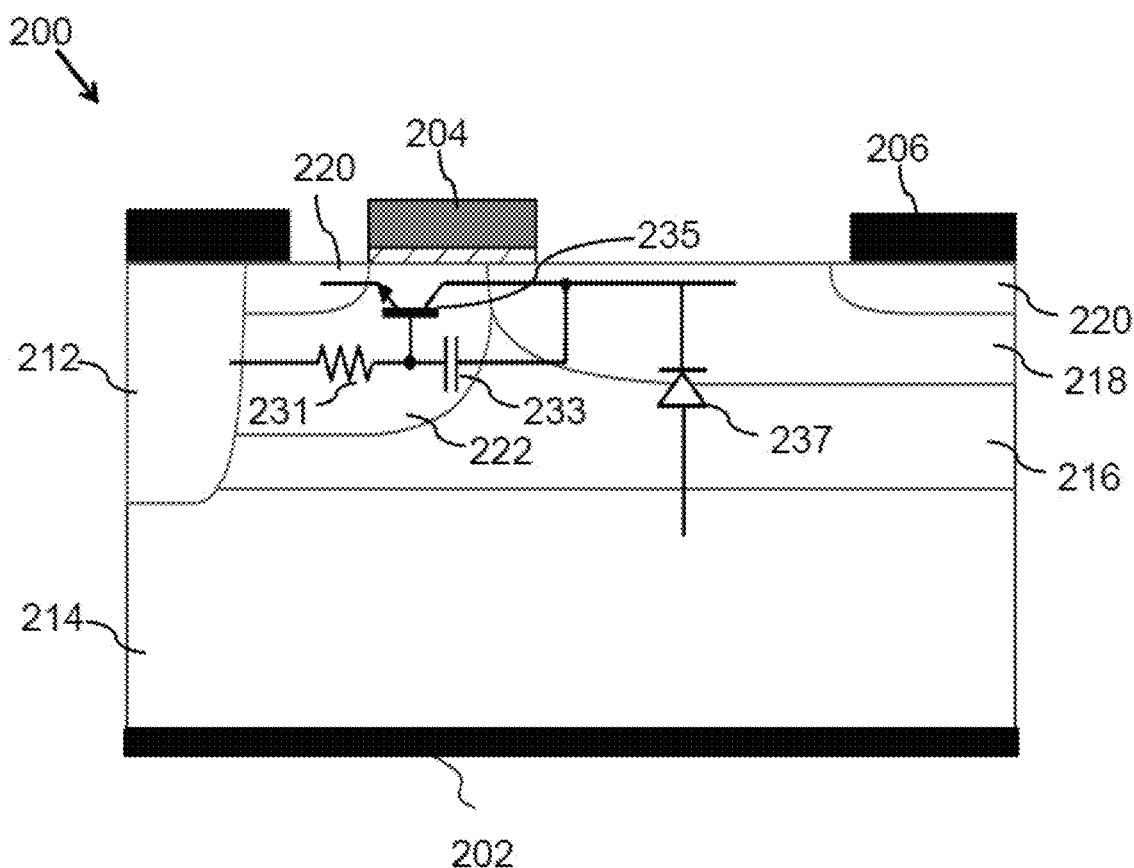

FIG. 2 shows a simplified sketch of a cross-section of a laterally diffused metal oxide semiconductor (LDMOS) field effect transistor 200. The LDMOS 200 comprises a source contact 202 at the bottom and a P+ substrate 214 arranged above the source contact 202. A P+ sinker 212 is provided at the left side above the P+ substrate 214. A P epi layer 216 is provided on the right side above the P+ substrate 214. An N drift region 218 is arranged on the right side above the P epi layer 216. The N drift region 218 encloses in the cross section an N+ region below a drain contact 206. A P base 222 is arranged between the P epi layer 216, the N drift region 218 and the P+ sinker 212. The P base 222 and the P+ sinker 212 enclose a N+ region 220. The P base 222 and a part of the N drift region 218 are arranged below an isolating layer provided between the semiconductor layers of the LDMOS 200 and a gate contact 204.

There are three different breakdown mechanisms if the voltage between drain contact 206 and source contact 202 exceeds the admissible value in case of a closed FET. The depletion area at the drain increases in case of a punch through with increasing voltage between drain contact 206 and source contact 202. A current IDS flows between the drain contact 206 and the source contact 202 as soon as the depletion area at the drain reaches a depletion area at the source. This may happen even if the voltage between gate and source VGS is below the threshold voltage $V_{th}$. This punch through breakdown is reversible as long as the FET is not damaged due to thermal overload.

The second case is the avalanche breakdown of parasitic body diode 237 of the FET. The avalanche breakdown happens where the electrical field is highest (where the N drift region 218 bends). The avalanche breakdown is reversible as long as the FET is not damaged due to thermal overload or does not generate enough charge carriers to open the parasitic BJT (snap-back).

In case of a snap-back or latch-back a parasitic bipolar transistor 235 is switched on. The parasitic bipolar transistor 235 is off during normal operation. FIG. 2 shows corresponding parasitic capacitor 233 and parasitic resistor 231 which are connected with the base of the parasitic bipolar transistor 235. The parasitic bipolar transistor 235 may switch on because of the parasitic capacitor 233 (parasitic drain-gate capacity) if the voltage at the drain rises fast (dV/dt) or due to charge carriers generated by avalanche breakdown of the parasitic body diode 237. It is not possible to control the FET by means of the gate contact 204 after switching on of the parasitic bipolar transistor 235. The FET (or part of its structure) is destroyed extremely fast if there is no external component to limit the drain current. Radio frequency power amplifiers do usually not comprise such external components.

Experimental investigations have shown that such a fatal snap-back may happen in radio frequency applications as, for example, operation of a plasma chamber in case of an arc discharge. The snap-back destroys the amplifier circuit within a very short period of time. The results of the experimental investigations are discussed with respect to FIG. 3 and FIG. 4.

Figure 3:
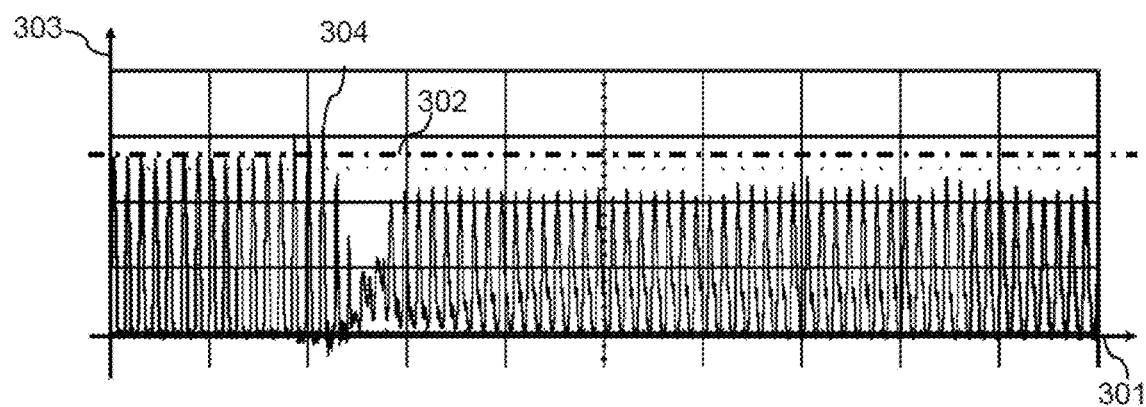
Figure 4:
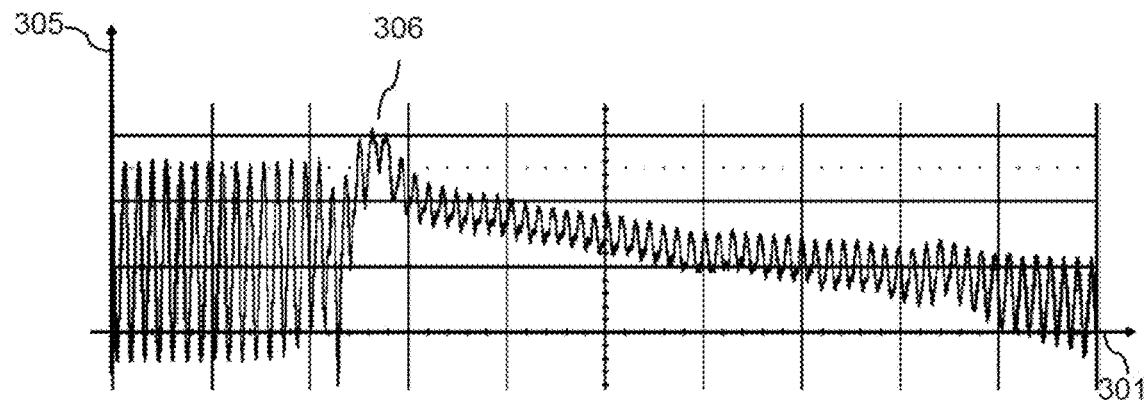

FIG. 3 shows a measured drain source voltage 304 during fatal breakdown of a FET in an amplifier circuit which was used to drive a plasma chamber. The abscissa shows the time 301 and the ordinate shows the drain source voltage 303. The time period is determined by the driving frequency of the plasma chamber which is in this case 13.56 MHz. The voltage between drain and source 304 exceeds a breakdown voltage 302 after some RF periods such that avalanche breakdown happens. The high avalanche energy causes a snap-back of the parasitic bipolar transistor (reference sign 235 in FIG. 2) and the FET is destroyed after few RF periods. The latter is confirmed by measurements of the voltage between gate and source 306 which is presented in FIG. 4. The abscissa shows again the time 301 and the ordinate the voltage between gate and source 305. The gate source voltage 306 raises abruptly at the same time as the drain source voltage 304 in FIG. 3 collapses. This abrupt raise and the reduction of the RF amplitude of the gate source voltage 306 is most likely caused by the FET in which the snap-back happens which is destroyed such that there is a low impedance between gate and drain. Parallel measurements of the reflected power (not shown) show that the time period at which the drain voltage exceeds the breakdown voltage coincides with the moment at which an impedance mismatch between the load impedance and the amplifier circuit happens (high reflected power). The impedance mismatch is most likely caused by an arc discharge within the plasma chamber (abrupt change of load impedance). The reflected power causes the over-voltage between the drain and the source and finally destruction of at least one FET of the amplifier circuit. The destruction of the FET happens within couple of RF periods and is therefore very fast.

Figure 5:
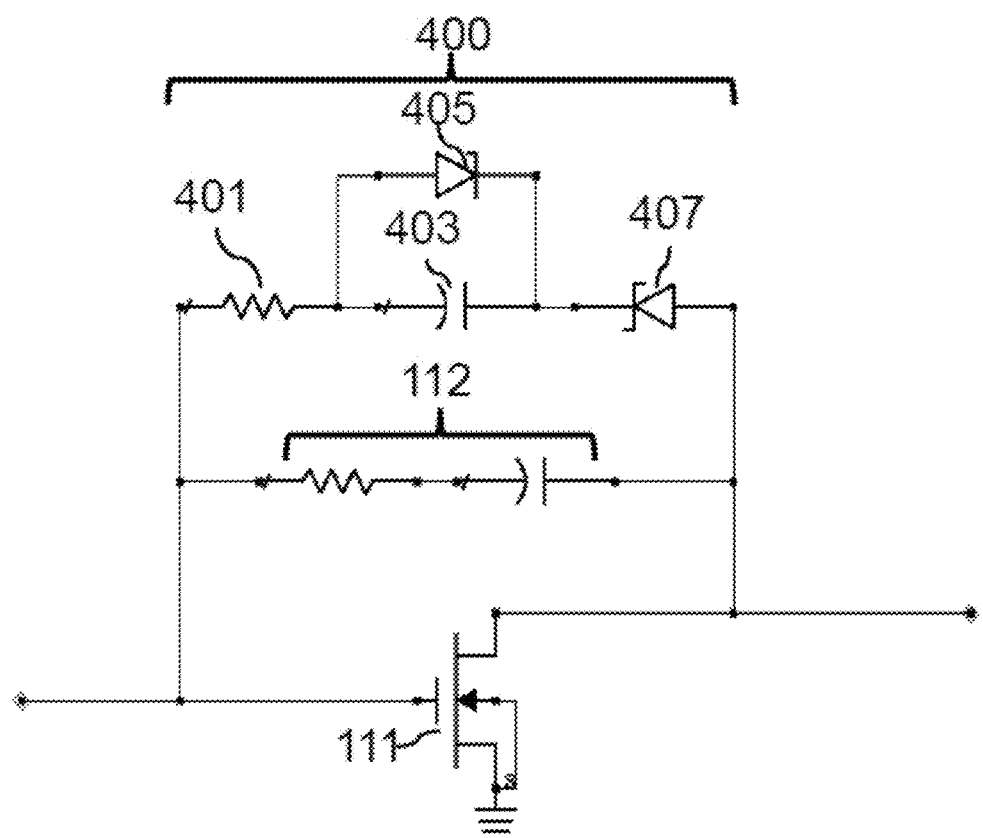

FIG. 5 shows a first example of an amplifier circuit comprising a protective feedback circuit 400. The amplifier circuit comprises one FET 111. A stabilizing feedback circuit 112 as discussed with respect to FIG. 1 is provided in parallel to the protective feedback circuit 400. The protective feedback circuit 400 comprises a switching diode 407, a capacitance 403, a voltage reference 405 which is arranged as an avalanche diode and a resistor 401. The switching diode 407 is a Schottky diode which is arranged in a series arrangement with the capacitance 403 (capacitance of 10 nF in this example) and the resistor 401 (resistance of 68 Ohm in this example). The avalanche diode is arranged reversed biased with respect to the drain of FET 111 parallel to the capacitance 403. The Schottky diode is forward biased with respect to the drain and charges the capacitance 403 to a peak voltage between drain and gate of the FET 111. The Schottky diode opens as soon as a voltage between drain and gate exceeds the sum of the voltage at the capacitance 403 and a threshold voltage of the Schottky diode. The threshold voltage of the Schottky diode is small and may therefore be neglected. The Schottky diode opens the current path across the capacitance 403 for short time periods during charging of the capacitance 403. The FET 111 opens shortly during these short time periods due to the feedback provided via the capacitance 403. Opening of the FET 111 is unwanted but does not hurt because of the shortness of the time periods. The FET 111 is closed again in the steady state of the drain voltage. The voltage between drain and gate during normal operation is equal or lower than the voltage on the capacitor. The Schottky diode is therefore closed during normal operation and no conducting path of the FET 111 is opened at these time periods. The voltage is limited by the feedback threshold voltage which is determined by the breakdown voltage of the avalanche diode. As soon as the voltage between drain and gate of FET 111 (or between drain and source because the potential difference between source and gate is negligible) exceeds the feedback threshold voltage a conductive bridge is open by means of the avalanche diode such that further rise of the voltage at the capacitance 403 is avoided. The Schottky diode opens in this case the main current path across the capacitance 403 such that the voltage at the gate rises and the FET 111 is opened. The FET provides the conducting path for dissipating at least the part of the over-voltage energy at the drain. The type of circuit components (resistance, capacitance and characteristic of diodes etc.) comprised by the protective feedback circuit depend on the amplifier circuit and especially on the FET. The fine tuning of the characteristics of the circuit components has to be performed by experiments.

Figure 6:
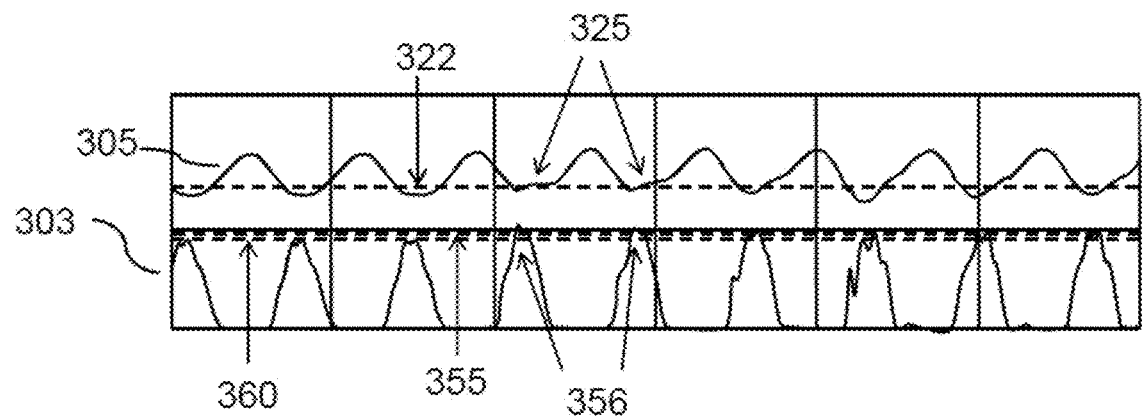

FIG. 6 shows the protective effect of the protective feedback circuit discussed with respect to FIG. 5. FIG. 6 is separated in nine RF periods. The first, the second and the third time period show normal operation of the amplifier circuit. The voltage between gate and source 305 is below a gate threshold voltage 322 as long as the FET should be closed. The drain source voltage 303 is during these three periods lower or equal than the feedback threshold voltage 355. The feedback threshold voltage 355 is slightly higher than the drain source peak voltage 360. The drain source voltage 303 exceeds in the fourth RF period the feedback threshold voltage 355. The protective feedback circuit provides at the same time a gate source voltage 305 such that the gate is pulled above the gate threshold voltage 325. The FET is opened at this moment and over-voltage energy at the drain is dissipated via its conductive path opened by means of the gate source voltage 305 which is pulled above the gate threshold voltage 325 during a time period at which the gate or more precise the FET is usually closed. Dissipation of the over-voltage energy at the drain avoids destruction of the FET until the voltage between drain and source 303 is below the feedback threshold voltage 355. The FET is closed again and the amplifier circuit operates in normal operation mode as shown in RF periods 7, 8 and especially 9.

Figure 7:
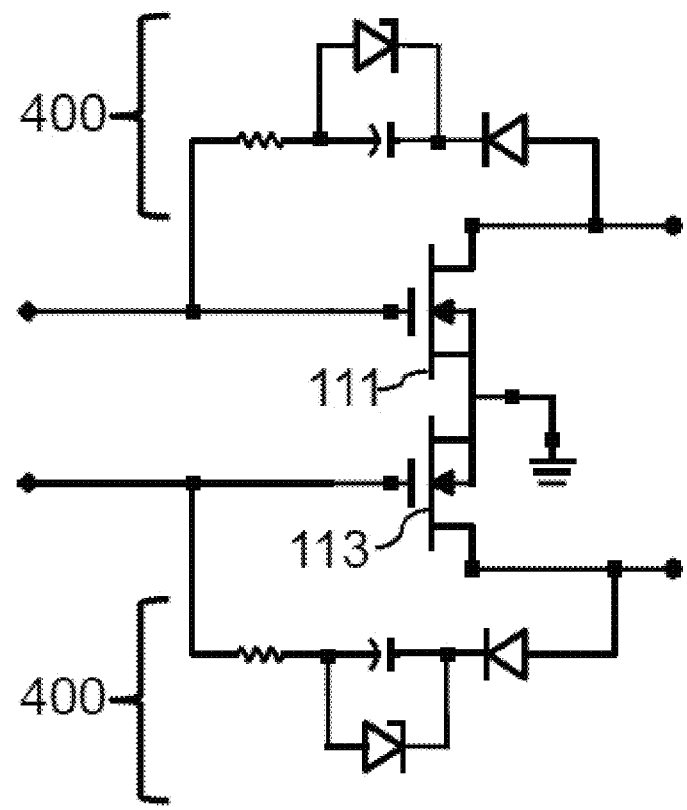

FIG. 7 shows a second example of an amplifier circuit comprising a protective feedback circuit 400. The amplifier circuit comprises two FETs 111, 113 in a push-pull arrangement as described with respect to FIG. 1. Each FET 111, 113 is protected by a separate protective feedback circuit 400 as discussed with respect to FIG. 5.

Figure 8:
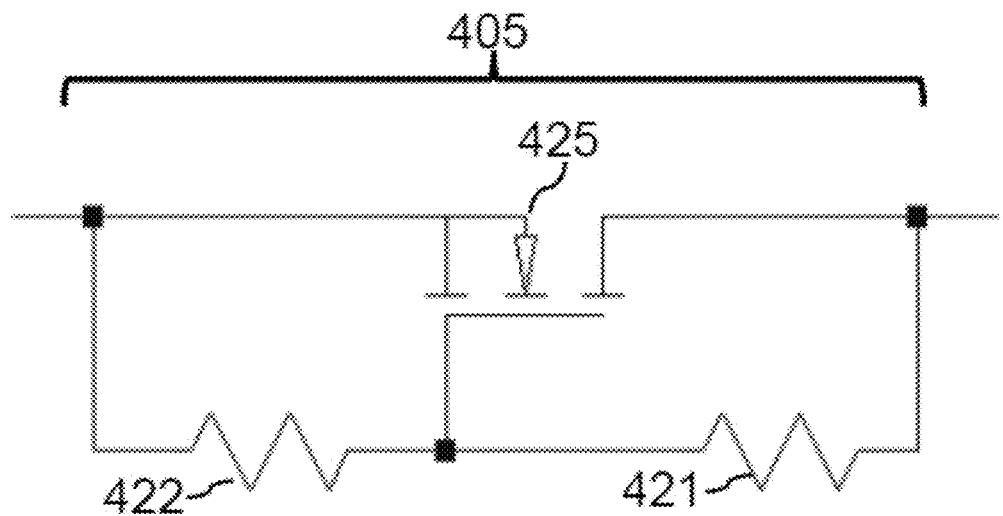

FIG. 8 shows an alternative example of a voltage reference 405. An alternative voltage reference may comprise a voltage reference field effect transistor 425 in combination with a first reference resistor 421 and a second reference resistor 422 which are arranged as a voltage divider with respect to the gate of the voltage reference field effect transistor 425. The resistances of the first reference resistor 421 and the second reference resistor 422 are arranged to determine the feedback threshold voltage. The feedback threshold voltage is in this example given by the threshold voltage of the protection field effect transistor 425 times the sum of the resistances of the first and the second reference resistor 421, 422 divided by the resistance of the second reference resistor 422.

Figure 9:
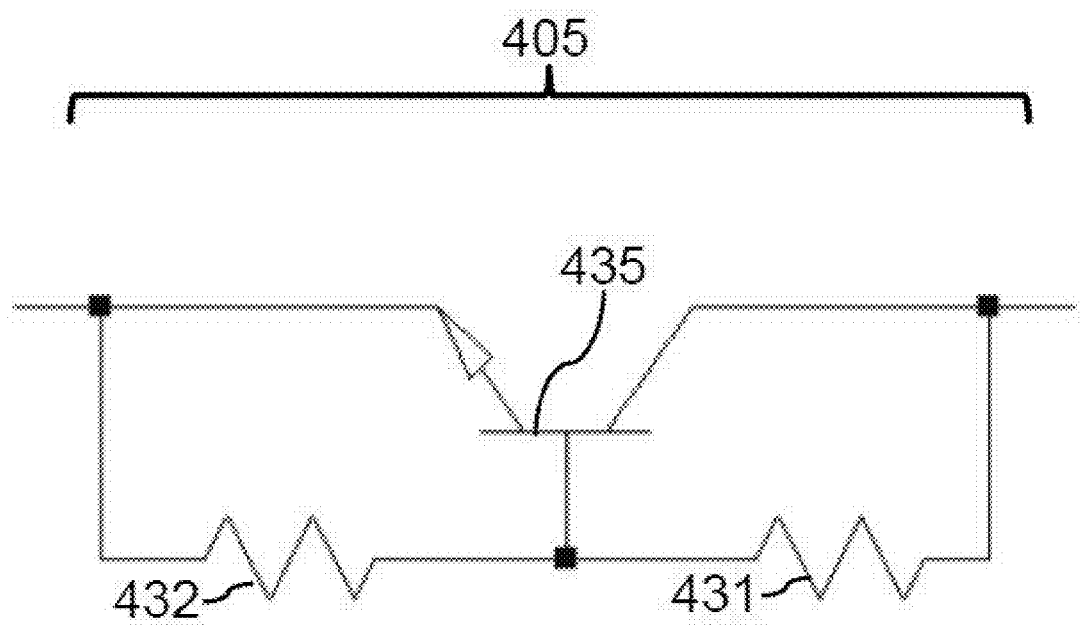

FIG. 9 shows a further alternative example of the voltage reference. An alternative voltage reference may comprise a voltage reference bipolar transistor 435 in combination with a third reference resistor 431 and a fourth reference resistor 432 which are arranged as a voltage divider with respect to the base of the voltage reference bipolar transistor 435. The resistances of the third reference resistor 431 and the fourth reference resistor 432 are arranged to determine the feedback threshold voltage. The feedback threshold voltage is in this example given by the forward voltage of the protection bipolar transistor 435 times the sum of the resistances of the third and the fourth reference resistor 431, 432 divided by the resistance of the fourth reference resistor 432.

While the disclosure has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of, or in addition to features already described herein.

Variations to the disclosed examples can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS

102 signal source
104 gate bias voltage source
106 input network
111, 113 field effect transistor
112, 114 stabilizing feedback circuit
124 DC power supply
126 output network
130 load
200 simplified cross-section of a LDMOS (lateral-diffusion metal oxide semiconductor) field-effect transistor
202 source contact
204 gate contact
206 drain contact
212 P+ sinker
214 P+ substrate
216 P epi
218 N drift region
220 N+ region
222 P base
231 parasitic resistor
233 parasitic capacitance
235 parasitic bipolar junction transistor
237 parasitic body diode
301 time
302 drain source breakdown voltage
303 drain source voltage
304 drain source voltage during fatal breakdown
305 gate source voltage
306 gate source voltage during fatal breakdown
322 gate threshold voltage
325 gate pulled above gate threshold voltage
355 feedback threshold voltage
356 drain voltage exceeds the feedback threshold voltage
360 drain-source peak voltage (normal operation)
400 protective feedback circuit
401 resistor
403 capacitance
405 voltage reference
407 switching diode
425 voltage reference field effect transistor
421 first reference resistor
422 second reference resistor
435 voltage reference bipolar transistor
431 third reference resistor
432 fourth reference resistor

The invention claimed is:

1. An amplifier circuit for providing an output of at least 100 W comprising a field effect transistor,
   wherein a drain of the field effect transistor is connected with a protective feedback circuit,
   wherein the protective feedback circuit is arranged to:
   reduce an over-voltage energy at the drain of the field effect transistor if a voltage between the drain and a gate of the field effect transistor exceeds a feedback threshold voltage, and
   increase a gate voltage of the field effect transistor above a gate threshold voltage after the voltage between the drain and the gate exceeds the feedback threshold voltage.

2. The amplifier circuit according to claim 1, wherein the drain of the field effect transistor is connected with the gate of the field effect transistor by means of the protective feedback circuit.

3. The amplifier circuit according to claim 2, wherein the protective feedback circuit is arranged to build up a conducting path in the field effect transistor such that at least a part of the over-voltage energy at the drain is dissipated by means of the conducting path.

4. The amplifier circuit according to claim 1, wherein the protective feedback circuit is arranged to reduce an energy of an avalanche breakdown of the field effect transistor.

5. An amplifier circuit for providing an output of at least 100 W, comprising a field effect transistor,
   wherein a drain of the field effect transistor is connected with a protective feedback circuit,
   wherein the protective feedback circuit is arranged to reduce an over-voltage energy at the drain of the field effect transistor if a voltage between the drain and a gate of the field effect transistor exceeds a feedback threshold,
   wherein the protective feedback circuit comprises a voltage reference, and
   wherein the voltage reference is arranged to open a current path if a voltage between the drain and a source of the field effect transistor exceeds the feedback threshold voltage.

6. The amplifier circuit according to claim 5, wherein the voltage reference comprises at least one avalanche diode arranged between the drain and the gate of the field effect transistor, wherein the avalanche diode is arranged to open the current path.

7. The amplifier circuit according to claim 6, wherein the protective feedback circuit comprises a capacitance arranged between the drain and the gate of the field effect transistor, wherein the at least one avalanche diode is arranged parallel to the capacitance.

8. The amplifier circuit according to claim 7, wherein the protective feedback circuit comprises a switching diode arranged between the capacitance and the drain, wherein the switching diode is arranged to charge the capacitance to a peak voltage between the drain and the gate.

9. The amplifier circuit according to claim 8, wherein the protective feedback circuit comprises a resistor arranged between the at least one avalanche diode and the gate of the field effect transistor, wherein the resistor is arranged to stabilize the protective feedback circuit.

10. An amplifier circuit for providing an output of at least 100 W, comprising a field effect transistor,
    wherein a drain of the field effect transistor is connected with a protective feedback circuit,
    wherein the protective feedback circuit is arranged to reduce an over-voltage energy at the drain of the field effect transistor if a voltage between the drain and a gate of the field effect transistor exceeds a feedback threshold,
    wherein the amplifier circuit comprises two field effect transistors arranged in a push pull arrangement, and
    wherein each of the field effect transistors is protected by a respective protective feedback circuit.

11. A radio frequency amplifier arrangement comprising the amplifier circuit according to claim 1, an input network and an output network, the radio frequency amplifier arrangement having a nominal operating frequency between 1 MHz and 100 MHz.

12. The radio frequency amplifier arrangement of claim 11, wherein the nominal operating frequency is between 5 MHz and 85 MHz.

13. An electrical radio frequency generator for supplying electrical radio frequency to a load, the electrical radio frequency generator comprising the radio frequency amplifier arrangement according to claim 11.

14. A plasma processing system comprising the electrical radio frequency generator according to claim 13 and a plasma chamber.

15. A method of protecting a field effect transistor in an amplifier circuit according to claim 1 for providing an output at least 100 W, the method comprising:
    providing the feedback threshold voltage,
    reducing the energy at the drain of the field effect transistor if the voltage between the drain and the gate of the field effect transistor exceeds the feedback threshold voltage.

16. A method of protecting a field effect transistor in an amplifier circuit according to claim 5 for providing an output at least 100 W, the method comprising:
    providing a feedback threshold voltage, and
    reducing the energy at the drain of the field effect transistor if the voltage between the drain and the gate of the field effect transistor exceeds the feedback threshold voltage.

17. A method of protecting a field effect transistor in an amplifier circuit according to claim 10 for providing an output at least 100 W, the method comprising:
    providing a feedback threshold voltage, and
    reducing the energy at the drain of the field effect transistor if the voltage between the drain and the gate of the field effect transistor exceeds the feedback threshold voltage.

* * * * *